United States Patent
Ovadia

(10) Patent No.: US 9,858,371 B1
(45) Date of Patent: Jan. 2, 2018

(54) METHOD AND SYSTEM FOR GENERATING POST-SILICON VALIDATION TESTS

(71) Applicant: Cadence Design Systems, Inc., San Jose, CA (US)

(72) Inventor: Meir Ovadia, Rosh Ha-ayin (IL)

(73) Assignee: Cadence Design Systems, Inc., San Jose, CA (US)

( * ) Notice: Subject to any disclaimer, the term of this patent is extended or adjusted under 35 U.S.C. 154(b) by 17 days.

(21) Appl. No.: 15/149,304

(22) Filed: May 9, 2016

(51) Int. Cl.
*G06F 17/50* (2006.01)

(52) U.S. Cl.
CPC .............................. *G06F 17/5036* (2013.01)

(58) Field of Classification Search
CPC ...................................................... G06F 17/50
USPC ....................................................... 716/106
See application file for complete search history.

(56) References Cited

U.S. PATENT DOCUMENTS

2003/0101040 A1* 5/2003 Nightingale ... G01R 31/318357
703/17

* cited by examiner

*Primary Examiner* — Thuan Do
(74) *Attorney, Agent, or Firm* — Pearl Cohen Zedek Latzer Baratz LLP

(57) ABSTRACT

A method for generating a minimized combined scenario for use in simulation, from a post-silicon validation test that includes a combined scenario, may include obtaining a failed scenario loop of a scenario of the combined scenario that includes combined action scenarios that were executed in loops during a post-silicon validation test of a system on chip; and adding any loops of other scenarios of the combined scenario that were executed at least partially concurrently with the failed scenario loop, while discarding any loops of other scenarios of the combined scenario that were completed during the post-silicon validation test before the failed scenario loop or did not commence before the failed scenario loop was completed.

15 Claims, 9 Drawing Sheets

METHOD AND SYSTEM FOR GENERATING POST-SILICON VALIDATION TESTS

FIELD OF THE INVENTION

The present invention relates to system testing. More specifically, the present invention relates to a method and system for generating post-silicon validation tests.

BACKGROUND OF THE INVENTION

Design verification is a common process for testing a newly designed integrated circuit board, or system-level architecture, to confirm that it complies with the requirements defined by the specification of the architecture for that device. Design verification for a device under test (DUT) may be performed on the actual device, but usually a simulation model of the device is tested.

Verification of electronic designs has typically three forms. At an early stage, before the electronic design is implemented in hardware, simulation is conducted on a model of the design. Another form is emulation, in which one electronic hardware is used to mimic the behavior of another (tested) electronic hardware. At more advanced stages of design development a system on chip is validated, in a process which is typically referred to as post-silicon validation. Post-silicon validation is the last stage in the electronic design development, before it is manufactured.

Post-silicon validation tests are carried out on actual devices running at speed on realistic system boards, the results of which are assesed by a logic analyzer and other validation tools.

SUMMARY OF THE INVENTION

There is thus provided, according to some embodiments of the present invention, a method for generating a minimized combined scenario for use in simulation, from a post-silicon validation test that includes a combined scenario. The method may include obtaining a failed scenario loop of a scenario of the combined scenario that includes combined action scenarios that were executed in loops during a post-silicon validation test of a system on chip; and adding any loops of other scenarios of the combined scenario that were executed at least partially concurrently with the failed scenario loop, while discarding any loops of other scenarios of the combined scenario that were completed during the post-silicon validation test before the failed scenario loop or did not commence before the failed scenario loop was completed.

In some embodiments, the method may further include recording start time and end time for each action of the combined scenario during execution of the post-silicon validation test.

According to some embodiments, the method may further include forcing a first action in one scenario of the minimized combined scenario whose recorded end time is earlier than the recorded start time of a second action in another scenario of the minimized combined scenario to be executed at a simulation stage before the second action.

In some embodiments, the first action is forced to be to be executed before the second action, provided there are no other actions of scenarios of the combined scenario whose recorded start and end times are in between the recorded end time of the first action and the recorded start time of the second action.

In some embodiments, the first action is linked by an edge to the second action.

BRIEF DESCRIPTION OF THE DRAWINGS

In order to better understand the present invention, and appreciate its practical applications, the following figures are provided and referenced hereafter. It should be noted that the figures are given as examples only and in no way limit the scope of the invention. Like components are denoted by like reference numerals.

DETAILED DESCRIPTION OF THE INVENTION

Figure 1:
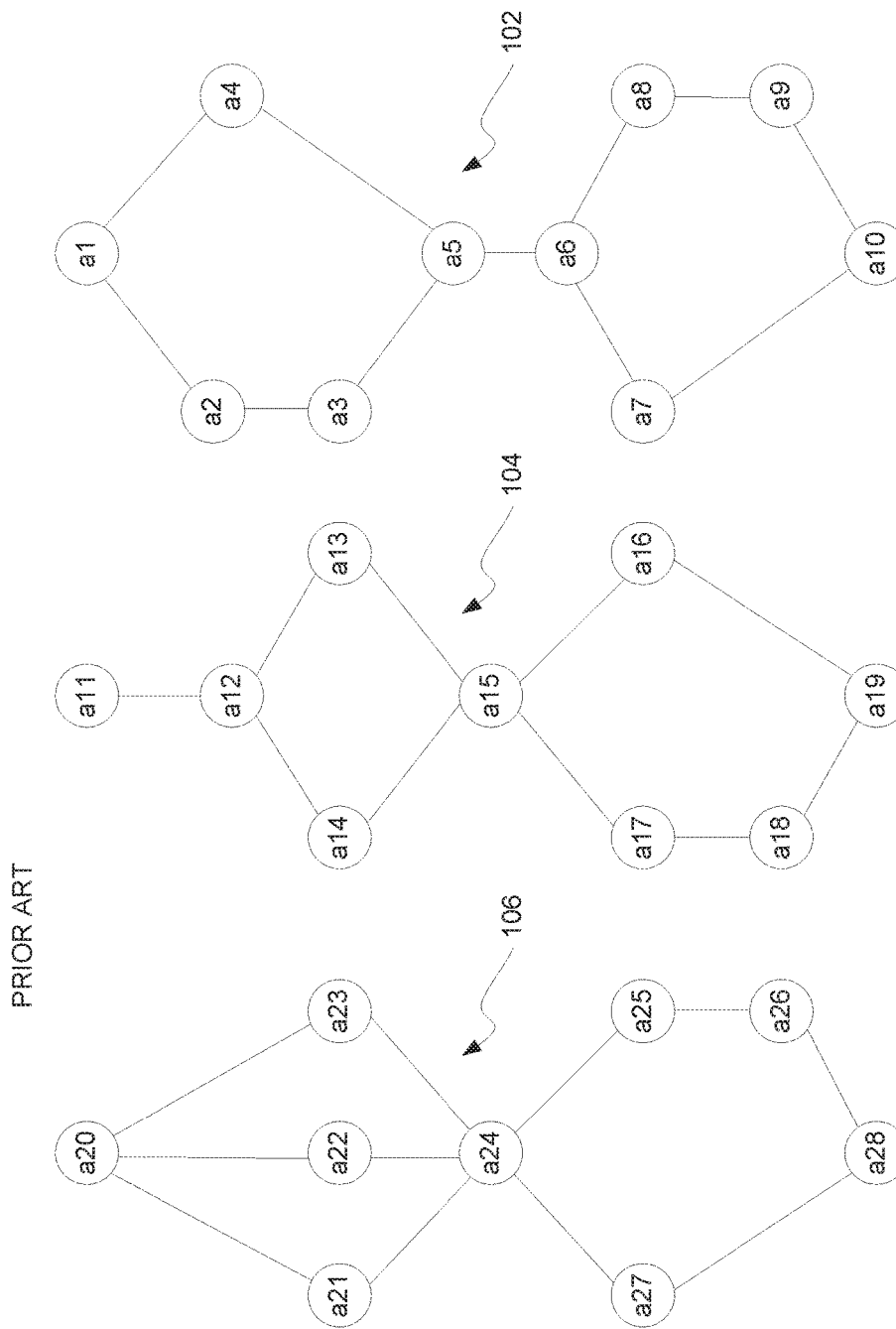
FIG. 1 illustrates three examples of validated scenarios—"solutions"—(prior art) originally constructed for use in simulation.

In the following detailed description, numerous specific details are set forth in order to provide a thorough understanding of the methods and systems. However, it will be understood by those skilled in the art that the present methods and systems may be practiced without these specific details. In other instances, well-known methods, procedures, and components have not been described in detail so as not to obscure the present methods and systems.

Although the examples disclosed and discussed herein are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method examples described herein are not constrained to a particular order or sequence. Additionally, some of the described method examples or elements thereof can occur or be performed at the same point in time.

Unless specifically stated otherwise, as apparent from the following discussions, it is appreciated that, throughout the specification, discussions utilizing terms such as "adding", "associating" "selecting," "evaluating," "processing," "computing," "calculating," "determining," "designating," "allocating" or the like, refer to the actions and/or processes of a computer, computer processor or computing system, or similar electronic computing device, that manipulate, execute and/or transform data represented as physical, such as electronic, quantities within the computing system's registers and/or memories into other data similarly represented as physical quantities within the computing system's memories, registers or other such information storage, transmission or display devices.

Scenario generally refers to a set of actions put together by a validation expert ("user") that is to be tested on the DUT. A valid scenario (a scenario that the DUT is meant to perform flawlessly) is generally referred to as "solution". After a solution is established it may be converted into a test (converted to executable code, such as, for example, C-code or Assembly). For brevity, we refer hereinafter to scenarios, but it should be understood that in the context of the present specification these terms (scenario, solution and test) are practically exchangeable unless stated otherwise.

An electronic system (e.g., a smartphone) is typically made up of a plurality of electronic devices (e.g., memory, camera, central processing unit—CPU, graphical processing unit—GPU, microphone, media player, etc.). At the early stages in the development of electronic design, a model of each of the electronic devices that form the electronic system is built (typically in Verilog or other HDL language and verified, by simulating executions of a multitude of tests on the on a simulation of the device under test (DUT). In order to efficiently cover all functionalities of the DUT a plurality of tests are generated (which are pieces of code, e.g., C-code, assembly), each of the tests based on one of a various scenarios which are constructed by a one or a plurality of users (hereinafter "user" or "users"). Each scenario is made up of a plurality of actions which the user selects to be included in the scenario. The user also defines the order in which the selected actions are to be performed—consecutively or concurrently. "Consecutively" means that actions are performed one at a time, the next action performed only after the previous action was completed, whereas "concurrently" means that two (or more) actions may be carried out within a prescribed timeframe, and only after completion of all concurrent actions the next consecutive action or actions may be performed.

Recently, a tool was developed that allows a user to construct an abstract scenario by dragging actions (actually symbols of such actions) from a set of available actions into a designated space in a graphical user interface, defining the relations between the selected actions (the order in which they are to be performed, e.g., sequentially or in parallel), and generating a test code from the constructed scenario.

FIG. 1 illustrates three examples, 102, 104 and 106, of validated scenarios—"solutions"—(prior art) that were originally constructed for use in simulation. Scenarios are constructed by verification experts to include a plurality of actions (a1, a2, a3, etc.) which are to be used for testing a DUT. The actions in a scenario are arranged in an orderly manner (as suggested in the graph representation of the scenario) defining the order in which the actions are to be performed. Some actions are meant to be executed consecutively, such as, for example, a1-a2-a3-a5 (in scenario 102), while some actions are to be executed concurrently, such as, for example, a13 and a14 in scenario 104. By "concurrent execution" of actions is not necessarily meant that these actions are performed simultaneously (but that may happen as well), rather it means that concurrently executed actions must all be completed before moving to the next action or actions.

In principle, the same valid scenarios may be used in simulation, in emulation or in post-silicon validation, but the run time of a test that is generated from the same scenario in simulation, in emulation or in post-silicon validation vary greatly. Just to comprehend the scales involved, a test that runs for about a minute in post-silicon validation (e.g., booting up a smartphone) may take a few days to run in simulation. Thus, a test that runs for a few hours in simulation runs only for a few seconds in the post-silicon validation stage.

Validated scenarios ("solutions") that were originally designed for simulation or emulation may also be used in constructing tests for post-silicon validation. Such an approach requires minimal effort from the user who can utilize scenarios that were originally constructed for the simulation stage, in the post-silicon validation stage. It is generally understood that users are interested in generating tests that would run a reasonable length of time and challenge the various components of a system on chip (SOC) in post-silicon validation.

A method for validating post-silicon SOC (which typically may be employed by a test generator of a post-silicon validation tool) includes selecting validated scenarios (solutions) that were originally designed for generating simulation tests of components of that SOC, combining them into a combined scenario, and generating from the combined scenario a validation test. The combined scenario is made up of a plurality of the selected solutions and after validating it (solving) it is used for generating a combined test configured to execute the plurality of the selected scenarios in parallel (concurrently) on the SOC.

In the process of constructing the combined scenario, validated scenarios addressing a single resource of the SOC, in a manner that is beyond a valid limitation of that resource (e.g., two actions addressing a device, such as the camera, that can be addressed only sequentially, or requiring more than a valid number of USB connections), may be excluded and not included in the combined scenario.

In the process of constructing the combined scenario, scenarios concurrently addressing a single resource, in a manner that is beyond a valid limitation of that resource, may be excluded and not included in the combined scenario, but scenarios that address the same resource at different times may be included in the combined scenario.

Figure 2A:
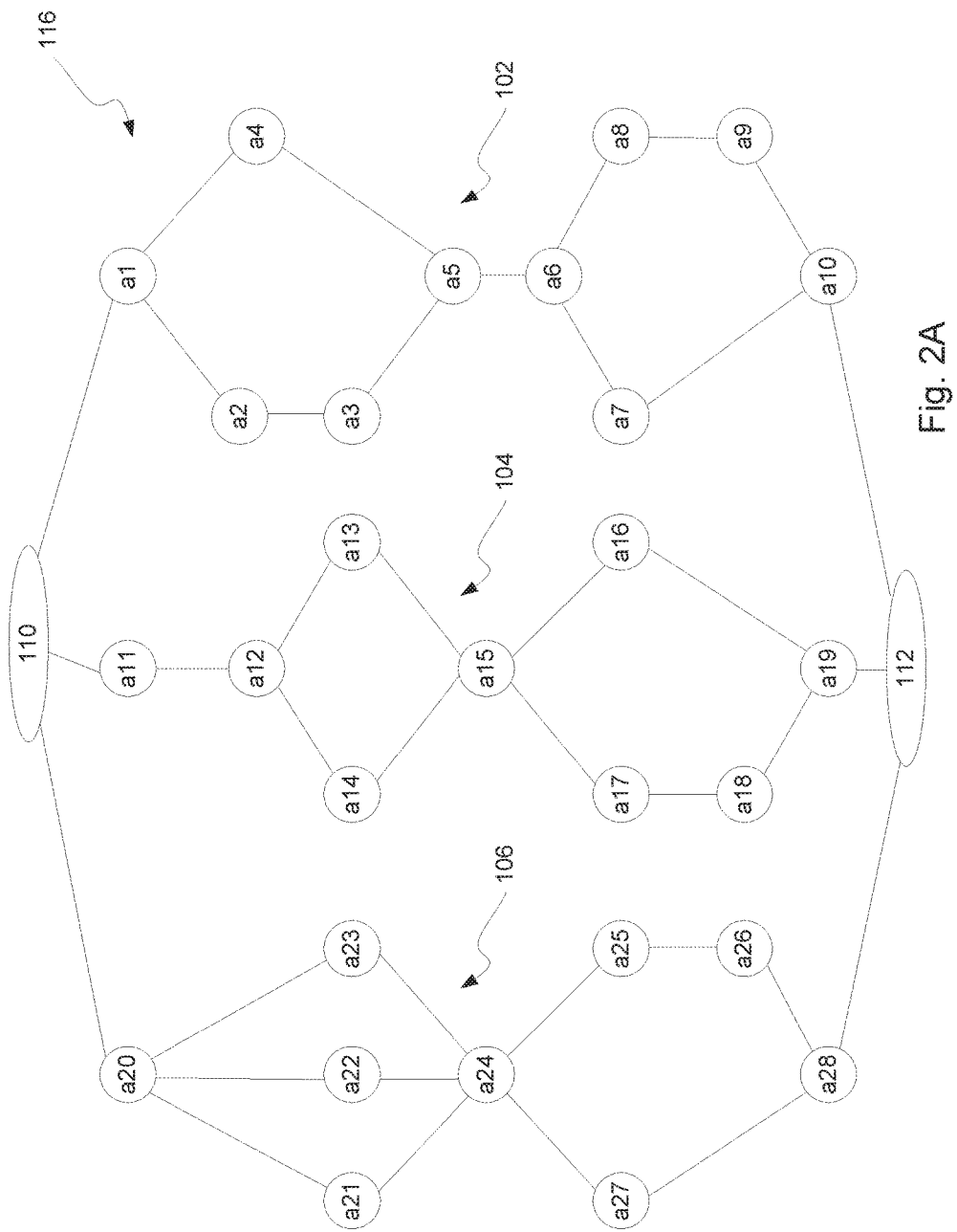
FIG. 2A illustrates a combined scenario for a post-silicon validation test according to some embodiments of the present invention.

FIG. 2A illustrates a combined scenario 116 for a post-silicon validation test according to some embodiments of the present invention. The combined scenario 116 includes three selected validated scenarios (solutions), 102, 104 and 106. The combined scenario, when converted into a test, would cause parallel concurrent execution of the three validated scenarios starting 110 with the first actions, a1, a11 and a20, and terminating 112, after completion of the last three parallel actions a10, a19 and a28. While the combined scenario depicted in this figure combines three scenarios, a combined scenario may include other numbers of scenarios.

Typically, according to some embodiments of the invention, a plurality of combined scenarios are constructed so as to generate a plurality of post-silicon validation tests. Such tests exhibit a variety of combined scenario, aimed at covering many versatile combined scenarios, thus testing various components of the SOC under different test scenarios.

The total run time of the combined test (the test that is generated from the combined scenario) is as long as the longest running scenario among the plurality of scenarios that make up the combined scenario. When dealing with scenarios that were originally designed for simulation, typical run time of such scenarios, when performed in the post-silicon validation stage is in the order of one or a few seconds.

Figure 2B:
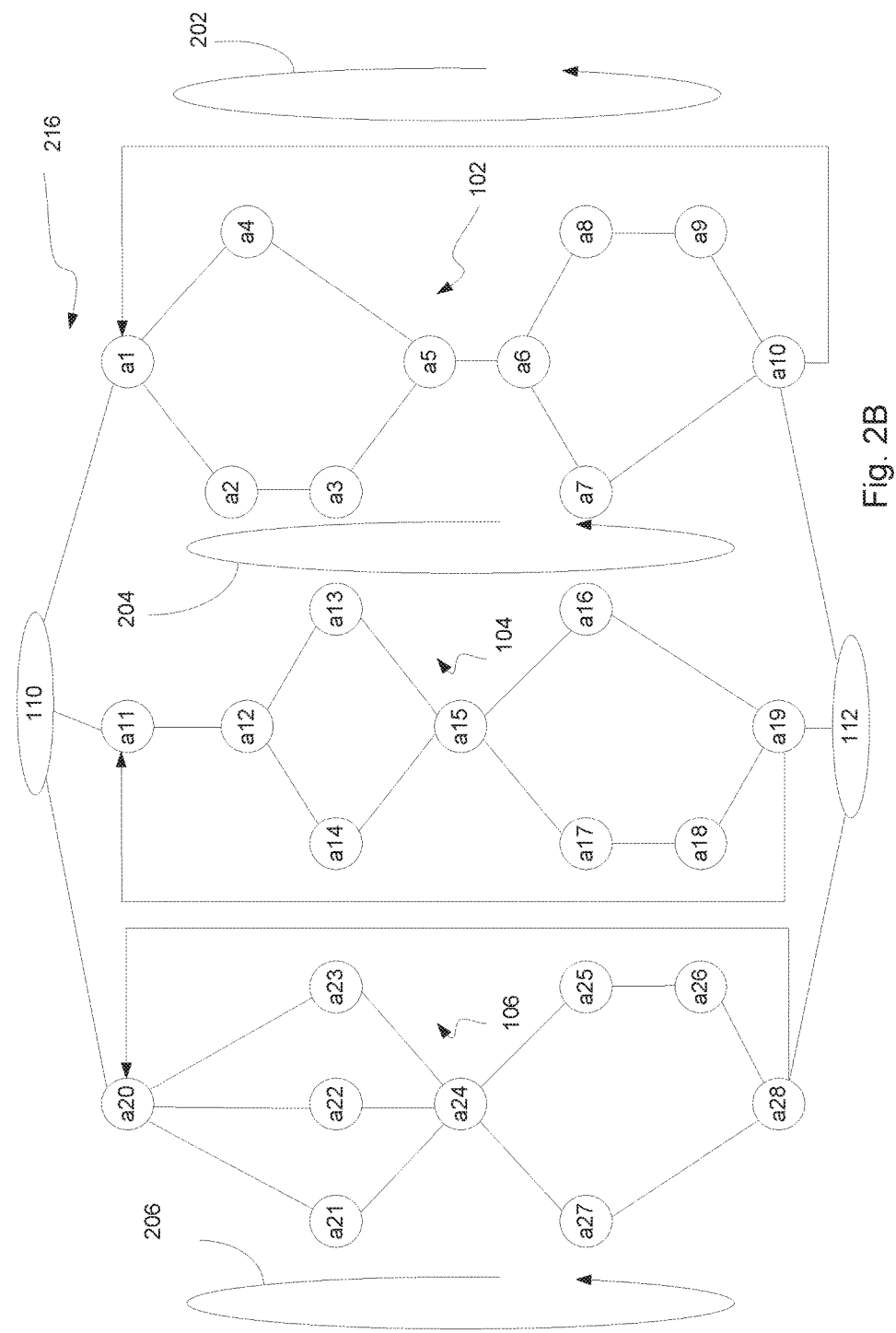
FIG. 2B illustrates a combined scenario for a post-silicon validation test according to some embodiments of the present invention that includes valid scenarios configured to be repeated in loops.

Thus, according to some embodiments of the present invention, each of the plurality of scenarios forming the combined scenario may configured to be repeated in loops, as shown in FIG. 2B. Each of the scenarios—102, 104 and 106, of the combined scenario 216, upon completion, is rerun again and again in a predetermined number of loops 202, 204 and 206, respectively.

Typically, different scenarios have different run times, which depend on the number and type of the various actions included in each scenario.

Figure 2C:
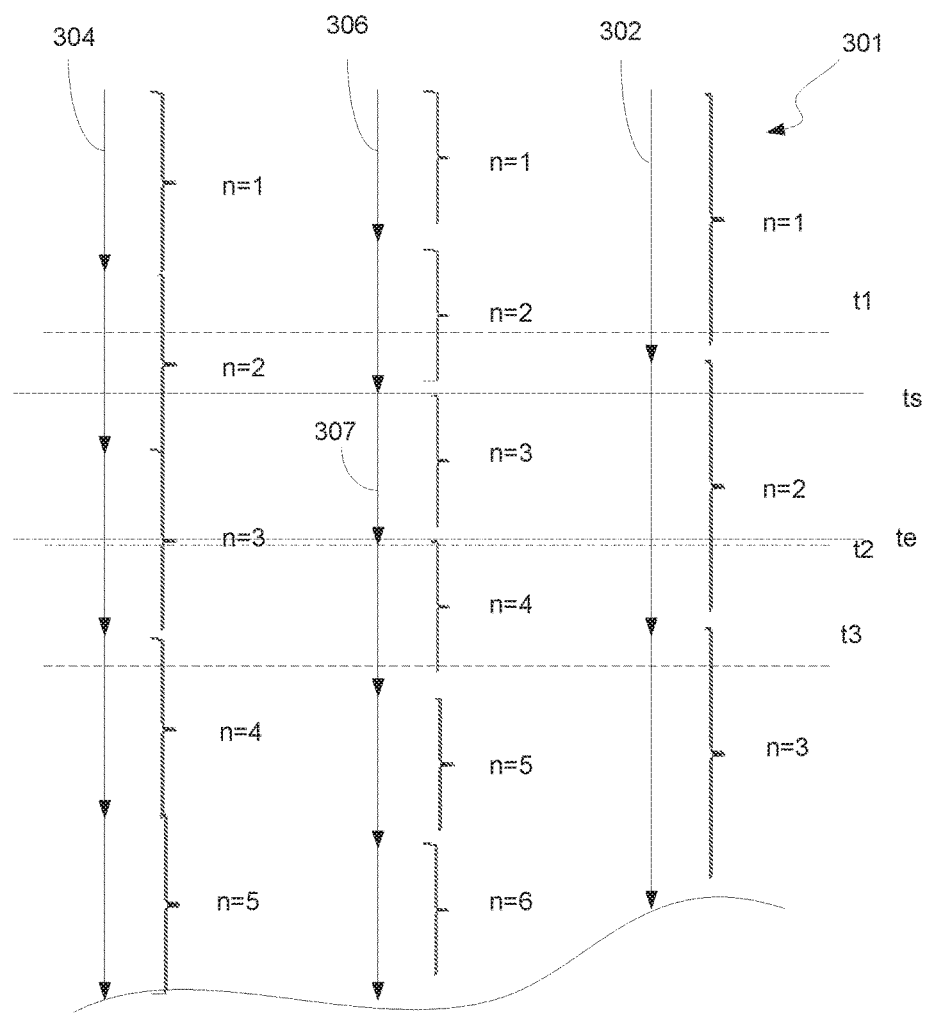
FIG. 2C illustrates time lines of the looped scenarios of a combined scenario, according to some embodiments of the present invention, in which each scenario is configured to be repeated in loops of predetermined number.

FIG. 2C illustrates time lines of the looped scenarios of a combined scenario 301, according to some embodiments of the present invention, in which each scenario is configured to be repeated in loops of predetermined number (the number of loops of each scenario in the combined scenarios may vary). The scenario of time line 302 (presented by an arrow) has a run time which is the longest among the displayed scenarios. The scenario presented by time line 304 has a shorter run time than the scenario of time line 302, but longer than the scenario presented in time line 308. The time lines in this figure are truncated for brevity. The number "n" of loops each scenario is configured to run may vary. It is evident that, as time progresses, the current execution state (the current combinations of actions performed at a current instance) during the execution of the combined test changes constantly, thereby increasing the versatility of the test instances. For example, at test instance t1 (denoted by the dashed line), the scenario of time line 302 is about to end its first run (n=1), while the scenario of timeline 306 is nearing a second run (n=2) completion, and the scenario of time line 304 is at the first half of the second run (n=2). At a second test instance t2, the scenario of time line 302 is in the second half of its second run (n=2), while the scenario of timeline 306 is just starting a fourth run (n=4), and the scenario of time line 304 has just completed half of the third run (n=3). At a third test instance t3, the scenario of time line 302 is in the first half of its third run (n=3), while the scenario of timeline 306 is about to send the fourth run (n=4), and the scenario of time line 304 is at the beginning of the fourth run (n=4). As a result of looping the scenarios of the combined scenario, the testing conditions constantly change, offering longer and more diverse tests, which are of greater interest to the user.

Thus, in accordance with some embodiments of the present invention, a user is able to generate a rich and diverse test in the post-silicon validation stage, with minimal effort. Instead of constructing new tests from scratch, the user can utilize, in the construction of a post-silicon validation test, the plurality of simulation scenarios that were previously constructed (in the simulation stage), combine a plurality of simulation scenarios, set the number of times the scenarios in the combined scenario are to be rerun and generate thereafter the combined test.

Figure 2D:
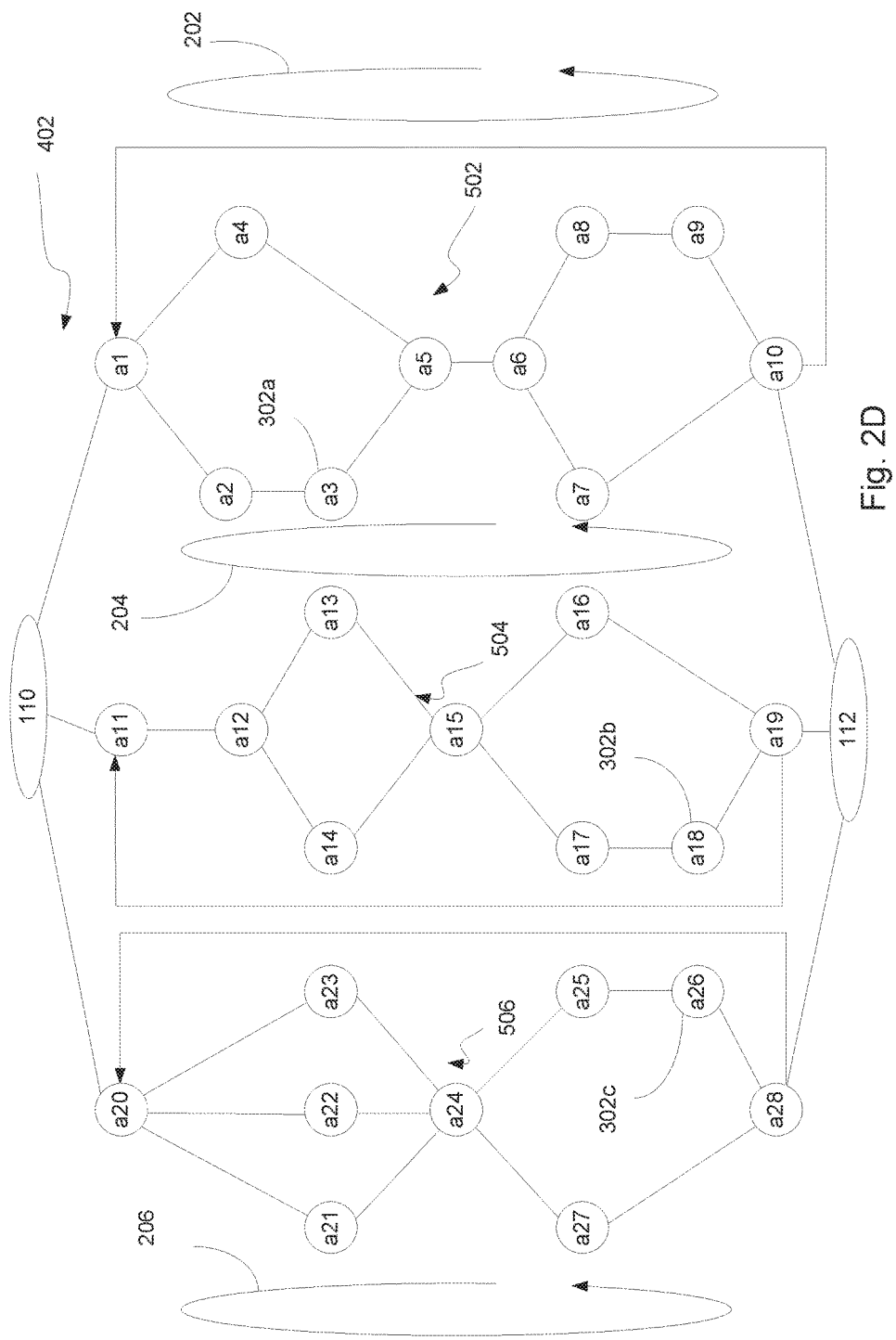
FIG. 2D illustrates a combined scenario for a post-silicon validation test according to some embodiments of the present invention that includes valid scenarios configured to be repeated in loops, wherein one or more of the actions included in the combined scenario are changed in each loop.

FIG. 2D illustrates a combined scenario 402 for a post-silicon validation test according to some embodiments of the present invention that includes valid scenarios 402, 404 and 406, configured to be repeated in loops, wherein one or more of the actions included in the combined scenario are changed in each loop.

In the example depicted in FIG. 2D, each of the three scenarios 502, 504 and 506 includes an action (action 302a, action 302b and action 302c, respectively) which it is desired to change for each looped run. These actions may be, for example, write commands (that typically include, each, a value and an address in memory into which the value is to be written). Without intervening as described hereinafter, in the conversion of the combined scenario into a test, the same value will be assigned in the final code to be written by the write command in each of the looped runs of the scenarios that includes these actions.

Therefore, in accordance with some embodiments of the present invention, before the generation of the combined test, the user adds to the appropriate scenario a command that is designed to produce a plurality of values during the generation of the combined test, such that the generated combined test causes different values to be written during the execution of the test code in the post-silicon validation stage. For example, in some embodiments, a user may set per a scenario or a solution a loop-counter with a value 'X' and the test generation tool automatically generates 'X' values per each generated/exported attribute/field (e.g. 'constraint loop-counter==X'). In some embodiments the test generation tool generates legal values for 'X' in compliance with one or more constraints. Consider, for example the following pseudo-code:

```
action A {
    value1: byte;
    value2: byte;
    constraint value1>=0;
    constraint value1+value2==10;
};
```

In the above example, if attributes 'value1' and 'value2' are exported to the C code (the generated test), then the tool is configured to generate 'X' legal values for 'value1' and 'value2' (not necessarily unique values), i.e., assuming the C side is implemented as 'C array of size X' then 'value1[i]' match 'value2[i]' for each 'i' in [0 . . . X-1].

Figure 3:
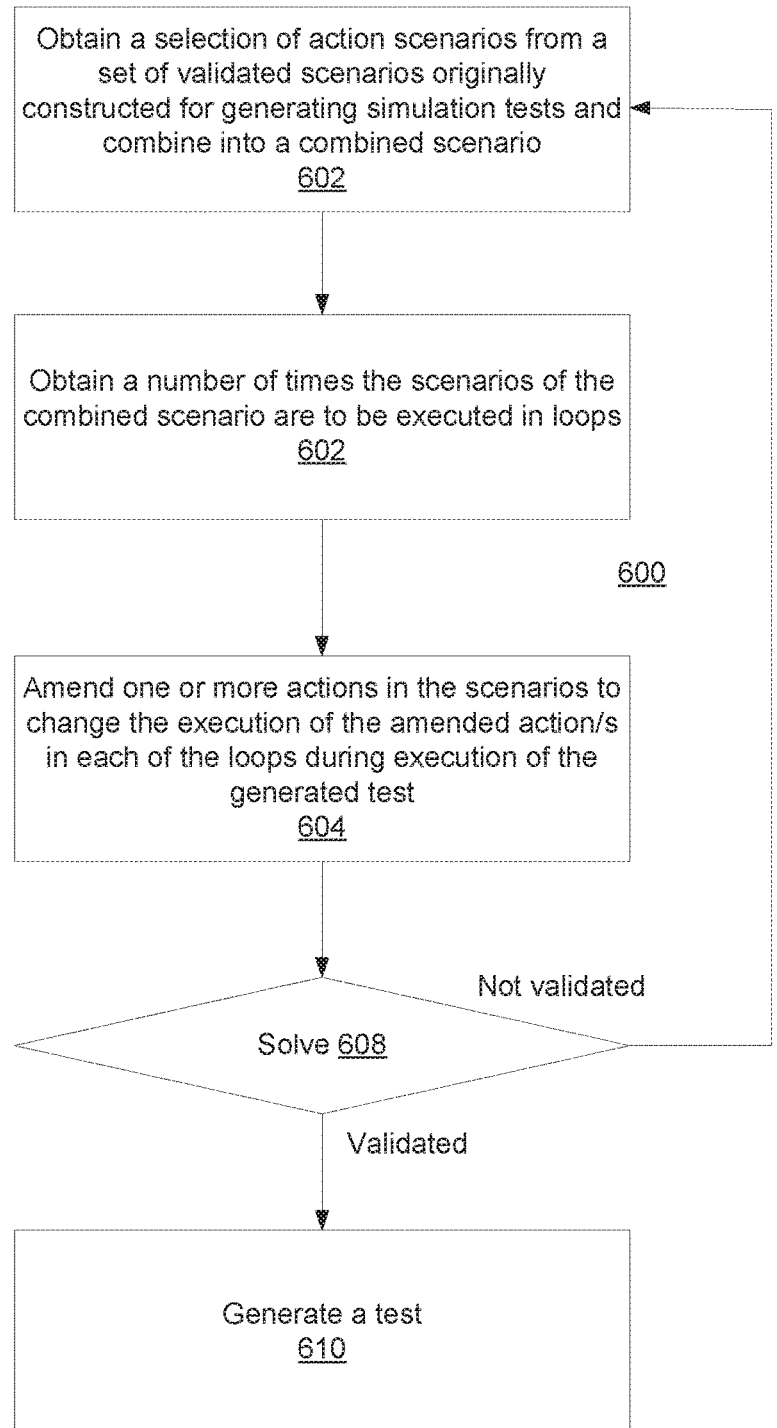
FIG. 3 illustrates a method for generating a post-silicon validation test, according to some embodiments of the present invention.

FIG. 3 illustrates a method 600 for generating a post-silicon validation test, according to some embodiments of the present invention.

Method 600 includes obtaining 602 a selection of scenarios from a set of validated scenarios (solutions) originally constructed for generating simulation tests (tests of DUTs that form components of an SOC to be tested in post silicon validation stage), and combine them into a combined scenario. Method 600 may also include obtaining 604 a number of times the scenarios of the combined scenario are to be executed in loops.

Method 600 may also include amending one or more actions in the scenarios of the combined scenario to change the execution of the amended action or actions in each of the loops during execution of the generated post-silicon validation test.

Then, the combined scenario is solved 608 by a tool solver. If the output solution is not validated, the above method steps are repeated to construct another combined scenario. If the solver output is validated, a test is generated from the combined scenario.

Post-silicon validation and debug is the last step in the development process of a semiconductor integrated circuit. In the pre-silicon stage, a DUT is tested in a virtual environment using simulation, emulation and formal verification tools.

In the simulation stage, typically only single scenarios are tested on the DUT. It is impractical to run a complete combined scenario in the simulation stage, due to the limitations of the available processing resources and the time it would take would by practically endless. In the post-silicon process, where the chip is nearly final, execution time is substantially faster, allowing the execution of complete combined scenarios, according to some embodiments of the present invention. However, debugging, in the post-silicon stage is extremely limited.

Thus, if a failure occurs when running a test on a SoC at the post-silicon stage, it is very likely that, unless a bug that caused that failure is easily located and fixed, in order to debug the design it would have to be returned to the simulator stage for re-examining (simulation and validation). When returning to the simulation stage, it is practically impossible to execute the entire combined scenario, and it is therefore required to choose specific portion of the test which is to be simulated. The selection of the portion of the test to be simulated requires skill and understanding of the possible cause or causes for the failure, and requires the ability to point at the portion of the test that is suspected as including the generator of the bug.

To date, various techniques and methods (e.g., heuristics) are used in the process of selecting the portion of the test for resimulation. "Resimulation" in the context of the present specification does not necessarily require that the same portion of the design be simulated as a whole. In fact, it may be required to select a portion that was not previously simulated as a whole in a single simulation (e.g., in some embodiments of the present invention, it may be desired to select two modules and simulate them concurrently, despite the fact that previously each module was simulated separately).

According to some embodiments of the present invention, a method is provided for minimizing a combined scenario that was designed for post-silicon stage for use in a simulation, by selecting only a portion of the combined scenario that is relevant to the discovered failure.

A debugger tool, in accordance with some embodiments of the present invention, identifies (e.g., receives, detects, etc.) a failed scenario of a combined scenario during which execution that failure occurred. For example, it may be determined that a failure occurred during the execution the third loop 307 of scenario 306 (n=3). The start time of the third loop 307 of scenario 306 (the "failed scenario loop") of combined scenario 301 is marked by dashed line ts, and the end time is marked by dashed line se.

A method for minimizing a combined scenario, according to some embodiments of the invention, includes discarding from the combined scenario any loops of scenarios whose end time occurs before ts (that is, scenarios that were fully completed before the start time of the identified loop of the failed scenario), and also discard from the combined scenario any loops of scenarios whose start time occurs after time te (that is, loops of scenarios that did not start before te), leaving only loops of scenarios that are executed concurrently with the loop of the failed scenario. By "executed concurrently", it is meant that at least some of these loops overlap in time with the failed scenario loop.

Thus, in the case of the combined scenario of FIG. 2C, the following scenario loops are discarded: the first loop of scenario 304, the first and second loops of scenario 306, and the first loop of scenario 302—all of which ended before time ts, as well as the fourth and further loops of scenario 304, the fourth and further loops of scenario 306, and the third and further loops of scenario 302—all of which were to start after time te.

The minimized combined scenario, therefore, includes only the third loop of scenario 306, the second and third loops of scenario 304, and the second loop of scenario 302.

Figure 4:
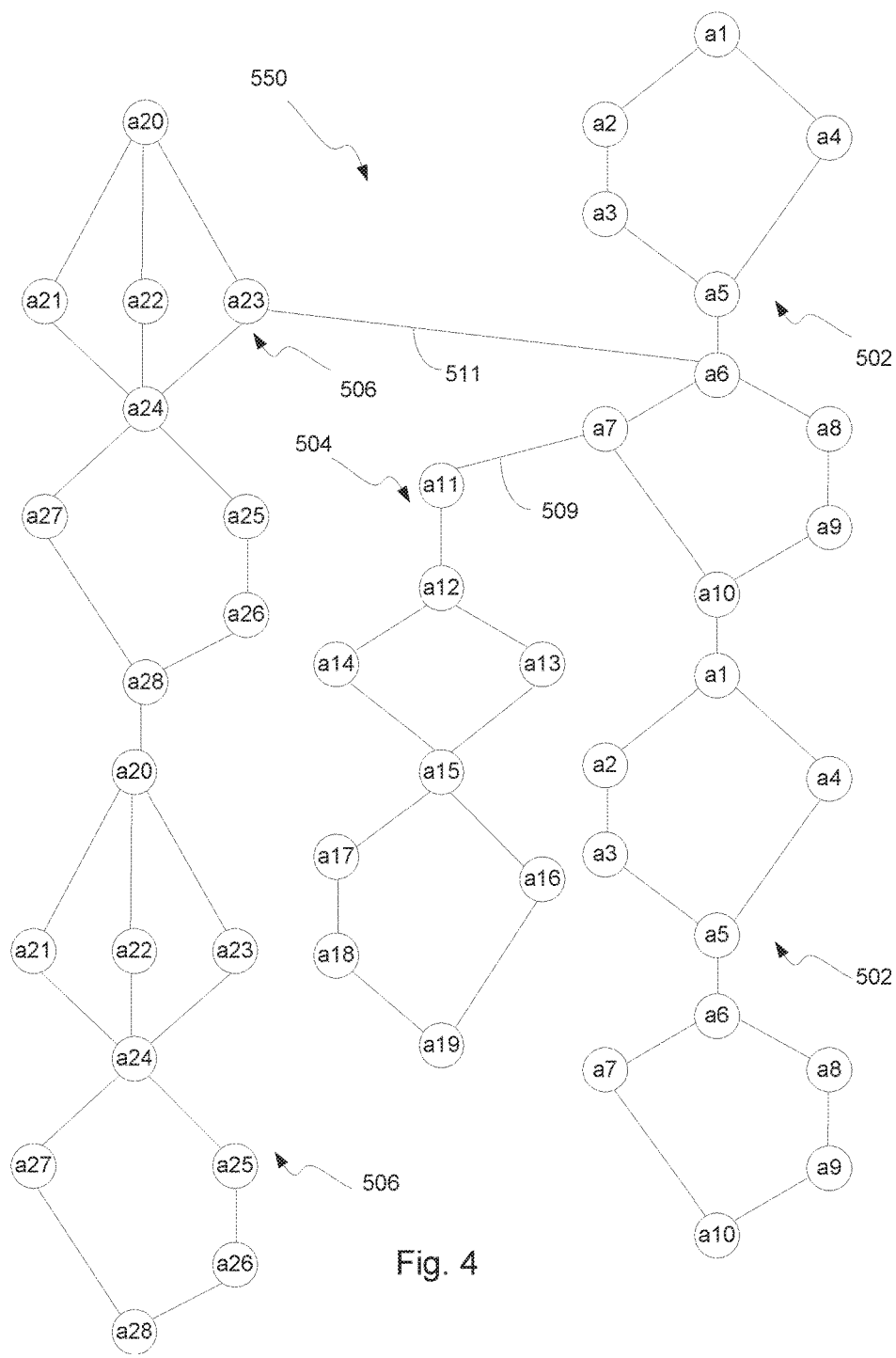
FIG. 4 illustrates a minimized combined scenario that was extracted from a combined scenario in accordance with some embodiments of the present invention.

FIG. 4 illustrates a minimized combined scenario 550 that was extracted from a combined scenario in accordance with some embodiments of the present invention. Minimized combined scenario 550 includes a failed scenario loop 504, as well as two consecutive loops of scenario 502 and two consecutive scenarios 506. The scenarios included in the minimized combined scenario 550 are either the failed scenario loop or any other scenario that was at least partially concurrently executed with the failed scenario loop during the failed test that was conducted on the post-silicon SoC.

If it is determined that simulation is needed, then a synchronization problem may arise. Changing the testing platform (from post-silicon to simulation) may cause unintentional change or changes in the execution of a scenario or a combined scenario. Repeating an execution of a specific scenario under the same conditions on the same testing platform is typically guaranteed to be executed in exactly the same manner. For example, if action a7, that belongs to scenario 502 completed execution in the post silicon stage before action 11 of scenario 504 had started, then each time the test is performed in the post silicon stage these actions will be executed in the same order. However, if the test is returned to the simulation stage, it is not guaranteed that the same execution order will be preserved.

Thus, in accordance with some embodiments of the present invention, the order of execution of actions that do not belong to the same scenario in the minimized combined scenario can be forced to be performed in the same order that they were performed in the post-silicon stage.

This may be achieved in the following manner. The start and end times of each of the actions of the scenarios of the combined scenario are recorded during execution at the post-silicon stage. The recorded start and end times of the actions may be saved in a database. A minimized combined scenario may be generated, in accordance with some embodiments of the present invention.

Then, a first action in one scenario of the minimized combined scenario whose recorded end time is earlier than the recorded start time of a second action in another scenario of the minimized combined scenario are linked by an edge (a graph link entity), provided there is no other action that was fully executed in between these two recorded times (in other words, there was no action whose recorded start time and recorded end time occurred in between the end time of the first action and the start time of the second action). For example, the end time of action a7 of scenario 502 is earlier than the start time of action a11 of scenario 504, and there are no other actions whose recorded start and end times occurred in between the end time of action a7 and the start time of action a11. Therefore, in accordance with some embodiments of the present invention, an edge 509 is added to link action 7 with action 11. The added edge 509 ensures that the order of execution (a7 before a11) is maintained even in the simulation stage. Similarly, action a23 in scenario 506 is linked to action a6 of scenario 502, to ensure that in the simulation stage their order of execution (a23 is completed before a6 commences) in the simulation stage.

Figure 5:
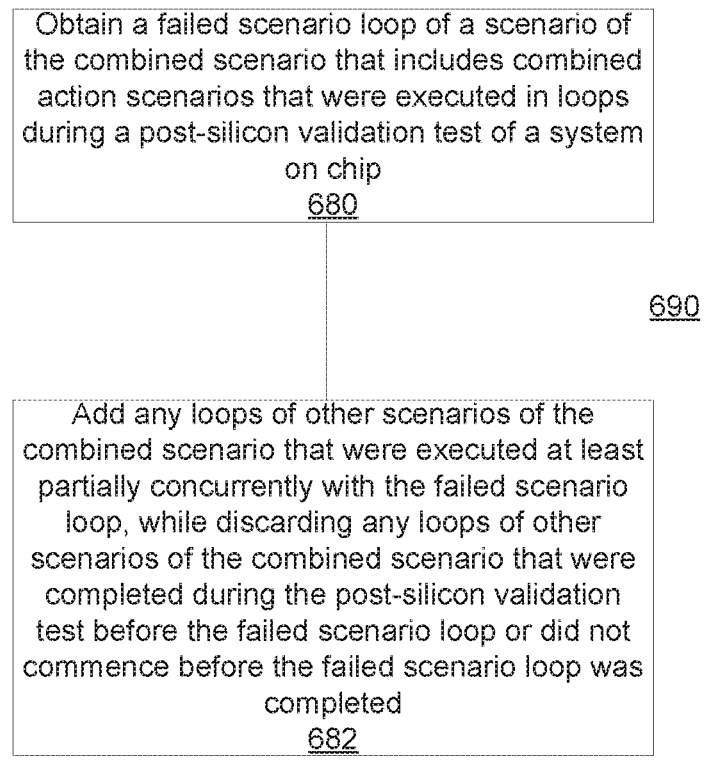
FIG. 5 illustrates a method for generating a minimized combined scenario for use in simulation, from a combined scenario that was generated and tested at a post-silicon stage, according to some embodiments of the present invention.

Thus, according to some embodiments of the present invention, a method 690 for generating a minimized combined scenario for use in simulation, from a combined scenario that was generated and tested at a post-silicon stage (see FIG. 5) may include obtaining 680 a failed scenario loop of a scenario of the combined scenario that includes combined action scenarios that were executed in loops during a post-silicon validation test of a system on chip; and adding 682 any loops of other scenarios of the combined scenario that were executed at least partially concurrently with the failed scenario loop, while discarding any loops of other scenarios of the combined scenario that were completed during the post-silicon validation test before the failed scenario loop or did not commence before the failed scenario loop was completed.

In some embodiments of the invention, the method may include recording start time and end time for each action of the combined scenario during execution of the post-silicon validation test.

In some embodiments, the method may also include forcing a first action in one scenario of the minimized combined scenario whose recorded end time is earlier than the recorded start time of a second action in another scenario of the minimized combined scenario to be executed at a simulation stage before the second action.

In some embodiments, the first action is forced to be to be executed before the second action, provided there are no other actions of scenarios of the combined scenario whose recorded start and end times are in between the recorded end time of the first action and the recorded start time of the second action.

According to some embodiments of the invention, the first action may be linked by an edge to the second action.

Figure 6:
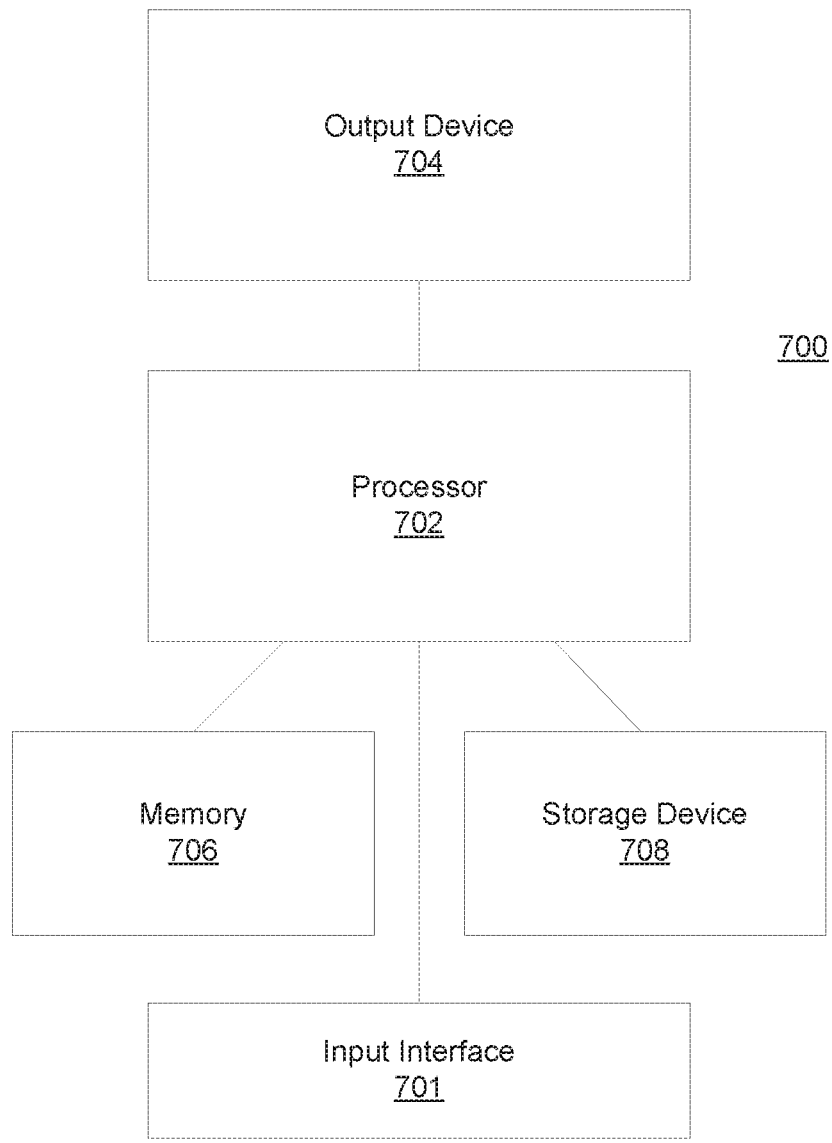
FIG. 6 illustrates a system for generating a post-silicon validation test, according to some embodiments of the present invention.

FIG. 6 illustrates a system 700 for generating post-silicon validation tests, according to some embodiments of the present invention. System 700 may include a processor 702 (e.g., single processor or a processing unit made that includes a plurality of processors, on a single machine or distributed on a plurality of machines) for executing a method according to some embodiments of the present invention. Processing unit 702 may be configured to obtain a selection of action scenarios from a set of scenarios originally constructed for generating simulation tests; to combine the selected scenarios into a combined scenario in which the selected scenarios are to be executed in parallel; and to generate a post-silicon test code corresponding to the combined scenario.

Processor 702 may be linked with memory 706 on which a program implementing a method according to some embodiments of the present invention and corresponding data may be loaded and run from, and storage device 708, which includes a non-transitory computer readable medium (or mediums) such as, for example, one or a plurality of hard disks, flash memory devices, etc. on which a program implementing a method according to some embodiments of the present invention and corresponding data may be stored. System 700 may further include an output device 704 (e.g. display device such as CRT, LCD, LED, etc.) on which one or a plurality user interfaces associated with a program implementing a method according to some embodiments of the present invention and corresponding data may be presented. System 700 may also include input interface 701, such as, for example, one or a plurality of keyboards, pointing devices, touch sensitive surfaces (e.g., touch sensitive screens), etc. for allowing a user to input commands and data.

Some embodiments of the present invention may be embodied in the form of a system, a method or a computer program product. Similarly, some embodiments may be embodied as hardware, software or a combination of both. Some embodiments may be embodied as a computer program product saved on one or more non-transitory computer readable medium (or media) in the form of computer readable program code embodied thereon. Such non-transitory computer readable medium may include instructions that, when executed, cause a processor to execute method steps in accordance with examples. In some examples, the instructions stores on the computer readable medium may be in the form of an installed application and in the form of an installation package.

Such instructions may be, for example, loaded by one or more processors and get executed.

For example, the computer readable medium may be a non-transitory computer readable storage medium. A non-transitory computer readable storage medium may be, for example, an electronic, optical, magnetic, electromagnetic, infrared, or semiconductor system, apparatus, or device, or any combination thereof.

Computer program code may be written in any suitable programming language. The program code may execute on a single computer system or on a plurality of computer systems.

Some embodiments are described hereinabove with reference to flowcharts and/or block diagrams depicting methods, systems and computer program products according to various embodiments.

Features of various embodiments discussed herein may be used with other embodiments discussed herein. The foregoing description of the embodiments has been presented for the purposes of illustration and description. It is not intended to be exhaustive or limiting to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes that fall within the true spirit of the present invention.

The invention claimed is:

1. A method for generating a minimized combined scenario for use in simulation, from a post-silicon validation test, the method comprising:
    recording during execution of the post-silicon validation test on a system on chip, the post-silicon validation test being generated from a combined scenario that includes execution in parallel of a plurality different scenarios, each scenario of said plurality of scenarios including a plurality of actions that are applied to the system, each scenario of said plurality of scenarios being executed in a repeated scenario loop, a run time of one of said plurality of scenarios being different from a run time of another of said plurality of scenarios, a start time and an end time for execution of each repetition of each scenario loop;
    obtaining by a debugger tool running on a processor the start time and end time of a failed scenario loop of the combined scenario during which a failure occurred; and
    extracting by the debugger tool a minimized combined scenario for execution at a simulation stage and that includes the failed scenario loop and any loops of other scenarios of the combined scenario whose execution started or completed after the start time of the failed scenario loop and, before the end time of the failed scenario loop.

2. The method of claim 1, further comprising forcing a first action in one scenario of the minimized combined scenario whose recorded end time is earlier than the recorded start time of a second action in another scenario of the minimized combined scenario to be executed at the simulation stage before the second action.

3. The method of claim 2, wherein the first action is forced to be to be executed before the second action provided there are no other actions of scenarios of the combined scenario whose recorded start and end times are in between the recorded end time of the first action and the recorded start time of the second action.

4. The method of claim 2, wherein the first action is linked by an edge to the second action.

5. The method of claim 1, wherein the recorded start and end times of the actions are saved in a database.

6. A non-transitory computer readable storage medium for generating a minimized combined scenario for use in simulation, from a post-silicon validation test, having stored thereon instructions that, when executed by a processor, will cause the processor to:
record during execution of the post-silicon validation test on a system on chip, the post-silicon validation test being generated from a combined scenario that includes execution in parallel of a plurality different scenarios, each scenario of said plurality of scenarios including a plurality of actions that are applied to the system, each scenario of said plurality of scenarios being executed in a repeated scenario loop, a run time of one of said plurality of scenarios being different from a run time of another of said plurality of scenarios, a start time and an end time for execution of each repetition of each scenario loop;
obtain the start time and end time of a failed scenario loop of the combined scenario during which a failure occurred; and
extract by the debugger tool a minimized combined scenario for execution at a simulation stage and that includes the failed scenario loop and any loops of other scenarios of the combined scenario whose execution started or completed after the start time of the failed scenario loop andbefore the end time of the failed scenario loop.

7. The non-transitory computer readable storage medium of claim 6, further having stored thereon instructions that when executed by a processor will cause the processor to: force a first action in one scenario of the minimized combined scenario whose recorded end time is earlier than the recorded start time of a second action in another scenario of the minimized combined scenario to be executed at the simulation stage before the second action.

8. The non-transitory computer readable storage medium of claim 7, wherein the first action is forced to be to be executed before the second action provided there are no other actions of scenarios of the combined scenario whose recorded start and end times are in between the recorded end time of the first action and the recorded start time of the second action.

9. The non-transitory computer readable storage medium of claim 7, wherein the first action is linked by an edge to the second action.

10. The non-transitory computer readable storage medium of claim 6, wherein the recorded start and end times of the actions are saved in a database.

11. A system for generating a minimized combined scenario for use in simulation, from a post-silicon validation test, the system comprising:
a memory, and
a processor configured to:
record during execution of the post-silicon validation test on a system on chip, the post-silicon validation test being generated from a combined scenario that includes execution in parallel of a plurality different scenarios, each scenario of said plurality of scenarios including a plurality of actions that are applied to the system, each scenario of said plurality of scenarios being executed in a repeated scenario loop, a run time of one of said plurality of scenarios being different from a run time of another of said plurality of scenarios, a start time and an end time for execution of each repetition of each scenario loop;
obtain the start time and end time of a failed scenario loop of the combined scenario during which a failure; and
extract by the debugger tool a minimized combined scenario for execution at a simulation stage and that includes the failed scenario loop and any loops of other scenarios of the combined scenario whose execution started or completed after the start time of the failed scenario loop and before the end time of the failed scenario loop.

12. The system of claim 11, wherein the processor is further configured to force a first action in one scenario of the minimized combined scenario whose recorded end time is earlier than the recorded start time of a second action in another scenario of the minimized combined scenario to be executed at the simulation stage before the second action.

13. The system of claim 12, wherein the first action is forced to be to be executed before the second action provided there are no other actions of scenarios of the combined scenario whose recorded start and end times are in between the recorded end time of the first action and the recorded start time of the second action.

14. The system of claim 12, wherein the first action is linked by an edge to the second action.

15. The system of claim 11, wherein the processor is configured to save the recorded start and end times of the actions in a database.

\* \* \* \* \*